United States Patent
Sharan et al.

(10) Patent No.: US 6,777,330 B2
(45) Date of Patent: Aug. 17, 2004

(54) CHEMISTRY FOR CHEMICAL VAPOR DEPOSITION OF TITANIUM CONTAINING FILMS

(75) Inventors: Sujit Sharan, Boise, ID (US); Howard E. Rhodes, Boise, ID (US); Philip J. Ireland, Nampa, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 10/144,614

(22) Filed: May 13, 2002

(65) Prior Publication Data

US 2002/0132475 A1 Sep. 19, 2002

Related U.S. Application Data

(63) Continuation of application No. 09/296,889, filed on Apr. 22, 1999, now Pat. No. 6,444,556.

(51) Int. Cl.[7] .............................................. H01L 21/44
(52) U.S. Cl. ...................... 438/683; 438/656; 438/680; 438/685; 438/694; 438/710; 438/711
(58) Field of Search ................... 438/683, 656, 438/680, 685, 694, 710, 711

(56) References Cited

U.S. PATENT DOCUMENTS

| | | | |
|---|---|---|---|
| 4,786,352 A | 11/1988 | Benzing | 156/345 |
| 4,897,709 A | 1/1990 | Yokoyama et al. | 357/68 |
| 5,399,379 A | * 3/1995 | Sandhu | 427/255.391 |
| 5,431,958 A | 7/1995 | Desu et al. | 427/255.3 |
| 5,455,138 A | 10/1995 | Okamura et al. | 430/128 |
| 5,510,151 A | 4/1996 | Matsuyama et al. | 427/509 |
| 5,567,243 A | 10/1996 | Foster et al. | 118/730 |
| 5,595,784 A | 1/1997 | Kaim et al. | 427/255.2 |
| 5,647,953 A | 7/1997 | Williams et al. | 156/643.1 |
| 5,723,382 A | * 3/1998 | Sandhu et al. | 438/653 |
| 5,747,116 A | 5/1998 | Sharan et al. | 427/534 |
| 5,834,371 A | 11/1998 | Ameen et al. | 438/656 |
| 5,888,906 A | 3/1999 | Sandhu et al. | 438/706 |
| 5,891,349 A | 4/1999 | Tobe et al. | 216/68 |
| 5,976,976 A | 11/1999 | Doan et al. | 438/683 |
| 6,090,709 A | 7/2000 | Kaloyeros et al. | 438/685 |
| 6,168,837 B1 | 1/2001 | Akram | 427/576 |
| 6,204,192 B1 | 3/2001 | Zhao et al. | 438/723 |
| 6,214,739 B1 | 4/2001 | Huang et al. | 438/709 |
| 6,218,300 B1 | * 4/2001 | Narwankar et al. | 438/685 |

* cited by examiner

Primary Examiner—Matthew Smith
Assistant Examiner—Victor V Yevsikov
(74) Attorney, Agent, or Firm—Fletcher Yoder

(57) ABSTRACT

Titanium-containing films exhibiting excellent uniformity and step coverage are deposited on semiconductor wafers in a cold wall reactor which has been modified to discharge plasma into the reaction chamber. Titanium tetrabromide, titanium tetraiodide, or titanium tetrachloride, along with hydrogen, enter the reaction chamber and come in contact with a heated semiconductor wafer, thereby depositing a thin titanium-containing film on the wafer's surface. Step coverage and deposition rate are enhanced by the presence of the plasma. The use of titanium tetrabromide or titanium tetraiodide instead of titanium tetrachloride also increases the deposition rate and allows for a lower reaction temperature. Titanium silicide and titanium nitride can also be deposited by this method by varying the gas incorporated with the titanium precursors.

18 Claims, 2 Drawing Sheets

CHEMISTRY FOR CHEMICAL VAPOR DEPOSITION OF TITANIUM CONTAINING FILMS

CROSS-REFERENCE TO RELATED APPLICATIONS

This application is a continuation of U.S. application Ser. No. 09/296,889, filed Apr. 22, 1999 now U.S. Pat. No. 6,444,556.

BACKGROUND OF THE INVENTION

1. Field of the Invention

The present invention relates generally to the field of integrated circuit manufacturing technology and, more particularly, to an improved method for depositing thin films.

2. Background of the Related Art

In the manufacturing of integrated circuits, numerous microelectronic circuits are simultaneously manufactured on semiconductor substrates. These substrates are usually referred to as wafers. A typical wafer is comprised of a number of different regions, known as die regions. When fabrication is complete, the wafer is cut along these die regions to form individual die. Each die contains at least one microelectronic circuit, which is typically replicated on each die. One example of a microelectronic circuit which can be fabricated in this way is a dynamic random access memory ("DRAM").

Although referred to as semiconductor devices, integrated circuits are in fact fabricated from numerous materials of varying electrical properties. These materials include insulators or dielectrics, such as silicon dioxide, and conductors, such as aluminum or tungsten, in addition to semiconductors, such as silicon and germanium.

In the manufacture of integrated circuits, conductive paths are formed to connect different circuit elements that have been fabricated within a die. One method to make these connections is through the use of openings in intermediate insulative layers. These openings are typically referred to as "contact openings" or "vias." A contact opening is typically created to expose an active region, commonly referred to as a doped region, while vias traditionally refer to any conductive path between any two or more layers in a semiconductor device.

After a contact opening, for instance, has been formed to expose an active region of the semiconductor substrate, an enhanced doping may be performed through the opening to create a localized region of increased carrier density within the bulk substrate. This enhanced region provides a better electrical connection with the conductive material which is subsequently deposited within the opening. One method of increasing conductivity further involves the deposition of a thin titanium-containing film, such as titanium silicide, over the wafer so that it covers the enhanced region prior to deposition of the conductive layer. Thin films of titanium-containing compounds also find other uses as well in the fabrication of integrated circuits. For example, titanium nitride is used as a diffusion barrier to prevent chemical attack of the substrate, as well as to provide a good adhesive surface for the subsequent deposition of tungsten.

Indeed, many reasons exist for depositing thin films between adjacent layers in a semiconductor device. For example, thin films may be used to prevent interdiffusion between adjacent layers or to increase adhesion between adjacent layers. Titanium nitride, titanium silicide, and metallic titanium are known in the art as materials that can be deposited as thin films to facilitate adhesion and to reduce interdiffusion between the layers of a semiconductor device. Other films that may be useful for these purposes also include titanium tungsten, tantalum nitride, and the ternary alloy composed of titanium, aluminum, and nitrogen.

The deposition of titanium-containing films is just one example of a step in the manufacture of semiconductor wafers. Indeed, any number of thin films, insulators, semiconductors, and conductors may be deposited onto a wafer to fabricate an integrated circuit. As the size of the microelectronic circuits, and therefore the size of die regions, decreases, the percentage of reliable circuits produced on any one wafer becomes highly dependent on the ability to deposit these thin films uniformly across the surface of the wafer. This includes uniform deposition on horizontal surfaces, slanted surfaces, and vertical surfaces, including those surfaces which define the walls and base of contacts and vias. If these thin films are not deposited in a uniform manner, gaps may be created which prevent the thin film from fully performing its function. The likelihood of the existence of these gaps tends to increase as the films become thinner.

Films may be deposited by several different methods, such as thermal growth, sputter deposition, spin-on deposition, chemical vapor deposition (CVD), and plasma enhanced chemical vapor deposition (PECVD). In thermal growth, the wafer substrate is heated at precisely controlled temperatures, typically between 800 and 1200° C., with a choice of ambient gases. The high temperature promotes the reaction between the ambient gas and the wafer substrate. For instance, films of silicon dioxide are often produced by this method. The problem with this method is the extremely high deposition temperatures required. Extremely high temperatures are a concern for two reasons. First, high temperature may be incompatible with or even detrimental to other elements of the integrated circuit, and, second, excessive cycling from low to high temperatures can damage a circuit, thereby reducing the percentage of reliable circuits produced from a wafer. Therefore, a lower deposition temperature is typically preferred as long as the characteristics of the deposited film are unaffected.

In sputter deposition, the material to be deposited is bombarded with positive inert ions. Once the material exceeds its heat of sublimation, atoms are ejected into the gas phase where they are subsequently deposited onto the substrate, which may or may not be negatively biased. Sputter deposition has been widely used in integrated circuit processes to deposit titanium-containing films. The primary disadvantage of sputter deposition is that it results in films having poor step coverage, so it may not be widely useable in submicron processes. Films deposited by sputter deposition on slanted or vertical surfaces do not exhibit uniform thickness, and the density of films deposited on these surfaces is usually not as high as the films deposited on horizontal surfaces.

In spin-on deposition, the material to be deposited is mixed with a suitable solvent and spun onto the substrate. The primary disadvantage of spin-on deposition is that nominal uniformity can only be achieved at relatively high thicknesses. Therefore, this method is primarily used for the deposition of photoresist and the like. It is generally not useful for the deposition of thin films.

As previously indicated, the trend for reducing the size of die regions has dictated the reduction of the thickness of many deposited films. These thin films need to have improved step coverage to reduce the number of gaps in the films and to increase the yield of operable devices. Of the methods discussed above, CVD and PECVD are best suited to deposit the thinnest films, as films deposited by sputter deposition on slanted or vertical surfaces do not exhibit the degree of uniformity obtainable by CVD and PECVD.

In CVD, the gas phase reduction of highly reactive chemicals under low pressure results in very uniform thin films. A basic CVD process used for depositing titanium involves a given composition of reactant gases and a diluent which are injected into a reactor containing one or more silicon wafers. The reactor is maintained at selected pressures and temperatures sufficient to initiate a reaction between the reactant gases. The reaction results in the deposition of a thin film on the wafer. If the gases include hydrogen and a titanium precursor, a titanium-containing film will be deposited. For example, if, in addition to hydrogen and the titanium precursor, the reactor contains a sufficient quantity of nitrogen or a silane, the resulting titanium-containing film will be titanium nitride and titanium suicide respectively. Plasma enhanced CVD is a form of CVD that includes bombarding the material to be deposited with a plasma to generate chemically reactive species at relatively low temperatures.

Chemical vapor deposition is typically carried out in one of two types of reactor. One type of reactor is called a hot wall reactor. A hot wall reactor is operated at a low pressure, typically 1 Torr or less, and high temperatures, typically 600° C. or greater. The other type of reactor is called a cold wall reactor. A cold wall reactor is operated at atmospheric pressure and low temperatures, typically 400 to 600° C.

The primary advantage of the hot wall reactor is that deposited films exhibit excellent purity and uniform step coverage. However, the hot wall reactor process is also characterized by low deposition rates, high temperatures, and the potential for the occurrence of unwanted reactions on the walls of the reaction chamber. Conversely, the cold wall reactor exhibits high deposition rates but poor step coverage.

Exposure to extreme temperatures and excessive cycling from low to high temperatures during the fabrication of integrated circuits can render the circuits useless. Therefore, a process for depositing films exhibiting uniform step coverage that can be conducted with a minimum of exposure to elevated temperatures could have a dramatic impact on the yield of reliable circuits. It has been thought that PECVD is the best method of achieving this result. In fact, plasma deposition has been used to produce titanium-containing films in a cold wall reactor maintained at approximately 400° C. The result of this deposition is thin titanium-containing films exhibiting good step coverage and growth rate.

However, the current plasma deposition technology does have its limitations. Because of the higher pressures associated with deposition in a cold wall reactor, it is difficult to deposit films that exhibit a high degree of uniform coverage in contacts and vias having high aspect ratios. This difficulty extends to both the vertical surfaces of the contacts and vias as well as the horizontal surfaces at the base of the contacts and vias.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a chemical vapor deposition process for depositing a titanium containing film on a substrate. The process includes the steps of: a) disposing the substrate inside a reaction chamber; b) bringing the substrate to a given temperature; c) introducing a titanium source gas, the titanium source gas being at least one of titanium bromide and titanium iodide, into the reaction chamber; d) introducing a reactant gas of at least one of hydrogen, silane, nitrogen and mixtures thereof into the reaction chamber; and e) discharging plasma inside the reaction chamber to deposit the titanium containing film onto the substrate.

In accordance another aspect of the present invention, there is provided a chemical vapor deposition process for depositing film on a substrate. The process includes the steps of: a) disposing the substrate inside a cold wall reaction chamber; b) bringing the substrate to a given temperature; c) introducing a titanium source gas selected from the group consisting of titanium bromide and titanium iodide into the reaction chamber; d) introducing a reactant gas of at least one of hydrogen, silane, nitrogen and mixtures thereof into the reaction chamber; and e) discharging plasma inside the reaction chamber to deposit the titanium containing film onto the substrate.

In accordance with still another aspect of the present invention, there is provided a chemical vapor deposition process for depositing titanium-containing films on a substrate. The process includes the steps of: a) disposing the substrate inside a reaction chamber maintained at a given temperature; b) introducing a titanium source gas into the reaction chamber; c) introducing a reactant gas into the reaction chamber; d) discharging plasma inside the reaction chamber and applying a voltage to substrate to bias the substrate to deposit a titanium-containing film onto the substrate.

In accordance with yet another aspect of the present invention, there is provided a chemical vapor deposition process for depositing a titanium-containing film on a substrate. The process includes the steps of: a) disposing the substrate inside a cold wall reaction chamber maintained at a given temperature; b) introducing a titanium source gas into the reaction chamber; c) introducing a reactant gas of at least one of hydrogen, silane, nitrogen, and mixtures thereof into the reaction chamber; and d) discharging plasma inside the reaction chamber and applying a voltage to the surface of the wafer to bias the surface to deposit the titanium-containing film onto the substrate.

In accordance with a further aspect of the present invention, there is provided an in-situ plasma cleaning process for cleaning contact openings. The process includes the steps of: a) disposing a substrate having contact openings inside a reaction chamber; b) bringing the substrate to a given temperature; c) introducing a cleaning agent of at least one of hydrogen, argon, or nitrogen trifluoride into the reaction chamber; d) discharging plasma inside the reaction chamber and applying a voltage to the substrate to bias the substrate to remove material from within the contact openings.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

In the interest of clarity, not all features of an actual implementation into an integrated circuit process are described in this specification. This illustration is restricted to those aspects of an integrated circuit process involving the deposition of thin films. Conventional details of integrated circuit processes, such as mask generation, resist casting, resist development, etching, doping, cleaning, implantation and annealing are not presented as such details are well known in the art of integrated circuit manufacture.

Figure 2:
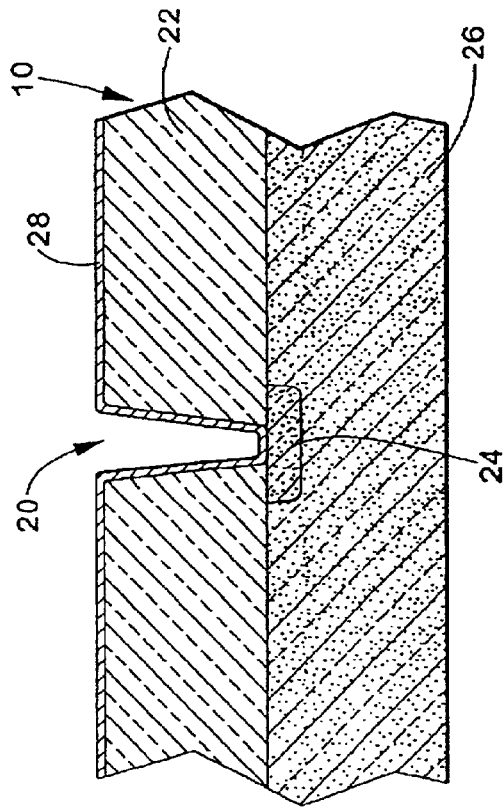
FIG. 2 is a diagrammatic cross-section of a semiconductor wafer processed in accordance with the present invention, wherein a thin film has been deposited onto the surface of a die including the surfaces of a contact opening.
Figure 1:
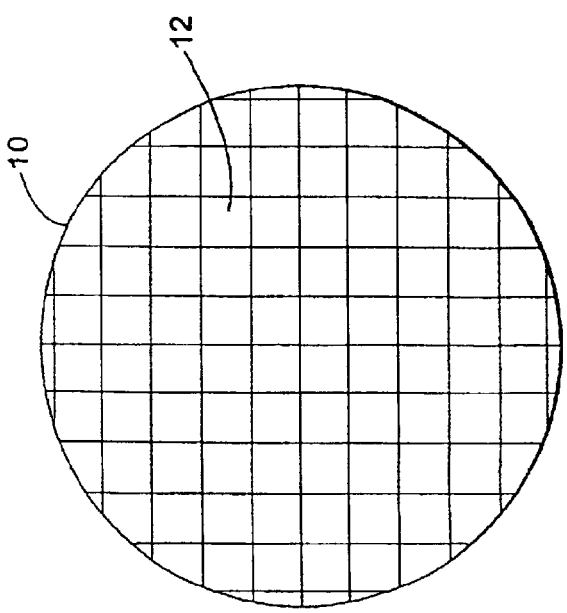
FIG. 1 illustrate a semiconductor wafer and its constituent die regions.
Figure 4:
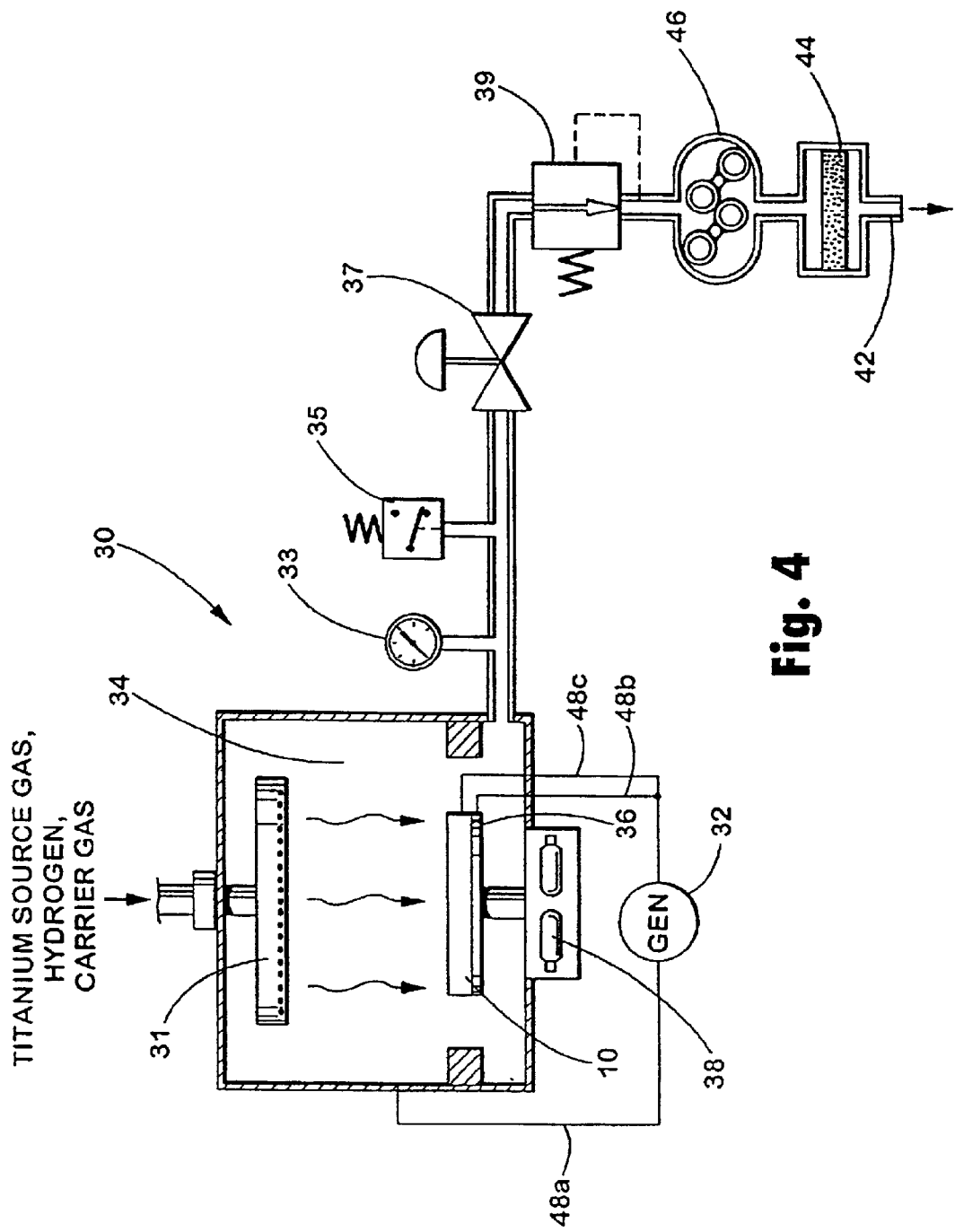
FIG. 4 is schematic diagram of a cold wall reactor used in chemical vapor deposition processes which has been modified to discharge plasma into the reaction chamber and which has been further modified to apply a voltage to the surface of the die.

Turning now to the drawings, a typical semiconductor wafer is illustrated in FIG. 1 and designated by a reference numeral 10. The wafer 10 includes a number of different regions, known as die regions 12. Each die region 12 may include an integrated circuit containing various features and fabricated using various materials and processes. For the purposes of this discussion, one of the die regions 12 will be discussed. The die region 12 includes a thin titanium-containing film. An example of such a film is illustrated in FIG. 2. Specifically, FIG. 2 illustrates a cross-sectional view of a die region 12 which includes an enhanced doped region or active region 24 within a semiconductor substrate 26. The active region 24 by be formed by an implantation process, for instance. The bulk substrate 26 is coated with an insulative layer 22, such as borophosphosilicate glass (BPSG) or phosphosilicate glass (PSG). The insulative layer 22 is etched to form a contact opening 20 through the insulative layer 22 to the active region 24. Of course it should be understood that the depiction of a contact opening to an active region is merely exemplary of a high-aspect ratio feature and that this discussion applies to other high-aspect ratio features, such as vias, as well.

Using the method described in detail below, a layer of titanium or titanium-containing film 28 is deposited across the wafer such that it lines the contact opening 20. The film 28 exhibits good adhesion to the contact opening 20 and the active region 24, along with excellent step coverage. The film 28 also exhibits good adhesion to a subsequently deposited conductive metal layer 21 illustrated in FIG. 3.

By known CVD processes, the only way good step coverage could be achieved was by deposition in a hot wall reactor. However, deposition in the hot wall reactor was achieved at low deposition rates and was often accompanied by unwanted reactions which occurred at the walls of the reactor. Conversely, use of a traditional cold wall reactor achieved more favorable deposition rates but sacrificed good step coverage. When a cold wall reactor is modified to discharge plasma into the reaction chamber, thin films are deposited that exhibit good step coverage as a result of using titanium tetrachloride as the titanium gas source.

Figure 3:
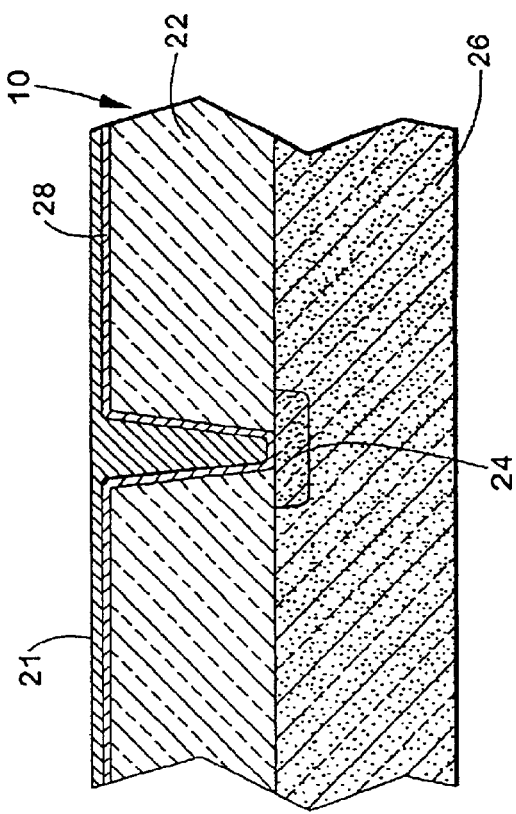
FIG. 3 is a diagrammatic cross-section of a semiconductor wafer processed in accordance with the present invention, wherein a conductive layer has been deposited onto the thin film previously deposited.

To perform the deposition of the film 28, a cold wall CVD reactor 30 is advantageously used, as illustrated in FIG. 3, although a similarly modified hot wall reactor may also be used under the conditions set forth below to achieve improvements. The cold wall CVD reactor 30 is modified with an RF generator 32. A titanium source gas, advantageously obtained from a titanium halide such as titanium tetrachloride, titanium bromide, or titanium iodide, and hydrogen are introduced into the reaction chamber 34 through a shower head 31. If so desired, a carrier gas, such as argon or helium, may be added to the reactant gases. The gases may or may not be pre-mixed. The gases are generally introduced through the shower head 31 to achieve good dispersion of the gases, but the gases can be introduced by other means. Desired reaction pressures are maintained by conventional pressure control components, including a pressure sensor 33, a pressure switch 35, an air operating vacuum valve 37, and a pressure control valve 39. The carrier gas and the resultant gas, such as HCl when titanium tetrachloride is used as the titanium precursor, given off during the reaction escapes from the reaction chamber 34 through an exhaust vent 42. These gases pass through a particulate filter 44, and gas removal is facilitated by a roots blower 46.

In the reactor chamber 34, a substrate holder 36 is heated to a temperature of less than 600° C., and typically less than 400° C. In fact, temperatures may be in the range of 200 to 350° C., with pressures in the range of 0.2 to 2.0 Torr. Heating may be achieved through the use of halogen lamps 38, so that the silicon wafer 10 is heated by convection. As the reactant gases enter the reaction chamber 34 through the shower head 31, a voltage is applied between the substrate holder 36 and the reaction chamber 34 for a period of from about 50 to 150 seconds typically. The voltage may be supplied by an RF generator 32 with one line 48a coupled to a wall of the reaction chamber 34 and another line 48b coupled to the substrate holder 36. The RF voltage causes the ionization of hydrogen gas present as a reactant to create a plasma of H⁺ ions. The plasma is discharged in the space above the wafer 10 to facilitate the deposition reaction.

If no further modification to the deposition process is made, films 28 are deposited at relatively high rates. These films 28 exhibit good step coverage which is not inherent in a cold wall reactor system in which plasma is not used. However, deposition along the surfaces of contacts 20 and vias is generally not optimal because the pressures associated with deposition preclude optimal deposition in the recesses of these conductive paths, particularly when a cold wall CVD reactor is employed.

However, a voltage, such as an RF voltage, may be applied to the surface of the wafer 10 via a line 48c from the RF generator 32. If this voltage is applied as the plasma is being discharged above the wafer 10, further improvements in step coverage can be achieved. In particular, step coverage along the surfaces of the contact 20 is improved. The applied voltage causes the surface of the wafer 10 to become biased. The charged surface attracts oppositely charged species from the space above the wafer 10. The charged species are drawn to the surface overcoming the pressures which had previously hindered deposition. Typically the surface of the wafer 10 is negatively biased to attract the positive metal cations.

As a cumulative result of this process, a chemical reaction occurs which results in the deposition of a titanium-containing film 28 along the exposed surfaces of the wafer 10. These surfaces include the vertical and horizontal surfaces of the contact 20. The deposited films 28 exhibit uniform step coverage. In particular, the vertical and horizontal surfaces of the contact 20 exhibit improved step coverage compared to films 28 deposited onto the surface of a wafer 10 which has not been biased. The films 28 which are typically deposited by this process using titanium tetrachloride are generally less than 3000 Å thick, and the reaction can be characterized as $TiCl_4+2H_2 \rightarrow Ti+4HCl$. The deposition of titanium from titanium tetrachloride in this manner generally requires an exposure period greater than 200 seconds.

Optionally, a reducing agent can be introduced into the reaction chamber 34 along with the titanium precursor and hydrogen. When this reducing agent is nitrogen, the titanium-containing film 28 which is deposited onto the wafer 10 is composed principally of titanium nitride, and the reaction can be characterized by $2TiCl_4+4H_2+N_2 \rightarrow 2TiN+8HCl$. When the reducing agent is a silane, the titanium containing film 28 which is deposited onto the wafer 10 is composed principally of elemental titanium and titanium silicide, and the reaction can be characterized by $3TiCl_4+2H_2+2SiH_4 \rightarrow 2Ti+TiSi_2+12HCl$.

As mentioned above, the modified reactor may contain titanium tetrabromide or titanium tetraiodide as the titanium source gas, instead of titanium tetrachloride. This results in the deposition of thin titanium films exhibiting good step coverage. It has been found that this deposition can be achieved at lower temperatures and in a shorter period of time as compared with known methods, partly as a result of titanium tetrabromide and titanium tetraiodide being more reactive than titanium tetrachloride. This results in a faster deposition rate of the titanium film, and allows for the reaction to be conducted at lower temperatures. For instance, the deposition of titanium-containing films exhibiting good step coverage can be achieved in less than 200 seconds of exposure at temperatures less than 350° C. The chemical reaction can be characterized by $TiBr_4$ (or $TiI_4$)$+2H_2 \rightarrow Ti+4HBr$ (or $4HI$).

The presence of the plasma allows for good step coverage under the temperature conditions normally employed in a cold wall reactor. Also, the wafer 10 may be biased as discussed above so that the material to be deposited is drawn into the contact 20 or via to improve the step coverage of the deposited film. Furthermore, as discussed previously, a reducing agent can be introduced into the reactor chamber along with the titanium precursor and hydrogen. When this reducing agent is nitrogen, the titanium-containing film deposited onto the wafer is composed principally of titanium nitride, and the reaction can be characterized by $2TiBr_4$ (or $2TiI_4$)$+4H_2+N_2 \rightarrow 2TiN+8HBr$ (or $8HI$). When the reducing agent is silane, the titanium containing film deposited onto the wafer is composed principally of elemental titanium and titanium silicide, and the reaction can be characterized by $3TiBr_4$ (or $3TiI_4$)$+2H_2+2SiH_4 \rightarrow 2Ti+TiSi_2+12HBr$ (or $12HI$).

As the size of devices decreases the thickness of these films 28, whether used as diffusion barriers or adhesive layers, also decreases. By ensuring the highest degree of uniform step coverage, the likelihood of producing a higher percentage of reliable devices increases. Additionally, depositing films 28 as discussed above results in a higher deposition rate. Because the deposited material is drawn into the contacts 20 and vias, the films 28 are deposited in a shorter period of time. This ability to deposit films 28 in a shorter period of time also increases the likelihood of obtaining a higher yield of reliable circuits. The barrier properties and adhesive properties of the deposited films 28 are generally at their lowest at elevated temperatures. Therefore, the longer the period of exposure to elevated temperatures, the greater the likelihood of producing faulty devices. Because deposition by the described methods results in deposition in a shorter period of time, the amount of time the wafer 10 is exposed to elevated temperatures decreases.

Furthermore, the methods may serve other uses. For example, an in-situ plasma cleaning of the surfaces of the contact or via, in particular the base of these conductive paths, can be conducted. It is not uncommon for oxides, particularly oxides of silicon, to form during semiconductor processes. The presence of these oxides is generally not desired. To conduct the cleaning operation which removes the unwanted oxides, the deposition process previously described is employed except that hydrogen, argon, and nitrogen trifluoride are charged to the reactor. When plasma is then discharged in the reactor, the oxide of silicon is converted into a volatile product, such as $SiF_4$, which is readily removed. If, in addition to discharging plasma into the reactor, a voltage is applied to the surface of the wafer to bias that surface negatively, the cleaning operation's efficiency at removing unwanted oxide deposits located along the walls and base of contacts and vias is increased. Without this modification, the cleaning agents may not overcome the reaction pressures and penetrate the recesses of the contacts and vias.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A chemical vapor deposition process for depositing a titanium containing film on a substrate, the process comprising the steps of:
    a) disposing the substrate inside a reaction chamber;
    b) bringing the substrate to a given temperature;
    c) introducing a titanium source gas, the titanium source gas being at least one of titanium bromide and titanium iodide, into the reaction chamber;
    d) introducing a reactant gas of at least one of hydrogen, silane, nitrogen and mixtures thereof into the reaction chamber; and
    e) discharging plasma inside the reaction chamber to deposit the titanium containing film onto the substrate.

2. The process of claim 1, wherein a deposition pressure between 0.2 and 2 Torr is maintained.

3. The process of claim 1, wherein the given temperature is less than 400° C.

4. The process of claim 1, wherein the reactant gas comprises hydrogen.

5. The process of claim 1, wherein the reactant gas comprises hydrogen and silane.

6. The process of claim 1, wherein the reactant gas comprises hydrogen and nitrogen.

7. A chemical vapor deposition process for depositing titanium containing film on a substrate, the process comprising the steps of:
    a) disposing the substrate inside a cold wall reaction chamber;
    b) bringing the substrate to a temperature less than 400° C.;

c) introducing a titanium source gas into the reaction chamber, the titanium source gas being one of titanium bromide and titanium iodide;

d) introducing a reactant gas into the reaction chamber, the reactant gas comprising hydrogen and silane; and e) discharging plasma inside the reaction chamber to deposit the titanium containing film onto the substrate.

8. The process of claim 7, wherein the substrate is brought to the given temperature by heating a substrate holder which secures the substrate.

9. The process of claim 8, wherein the substrate holder is heated to the given temperature by halogen lamps.

10. The process of claim 7, wherein the given temperature is in the range of 200° C. to 350° C.

11. The process of claim 7, wherein a deposition pressure between 0.2 and 2 Torr is maintained.

12. The proceess of claim 7, wherein the plasma is discharged inside the reaction chamber for less than 200 seconds.

13. An in-situ plasma cleaning process for cleaning contact openings, the process comprising the steps of:

a) disposing a substrate having contact openings inside a reaction chamber;

b) bringing the substrate to a given temperature less than 400° C.;

c) introducing a cleaning agent of at least one of hydrogen, argon, or nitrogen trifluoride into the reaction chamber; and d) discharging plasma inside the reaction chamber and applying a voltage to the substrate.

14. The process of claim 13, wherein the reactor pressure is between 0.2 and 2 Torr is maintained.

15. The process of claim 13, wherein the reaction chamber is a hot wall reaction chamber.

16. The process of claim 13, wherein the reaction chamber is a cold wall reaction chamber.

17. The process of claim 13, wherein hydrogen is added subsequent to nitrogen trifluoride and argon.

18. The process of claim 13, wherein the voltage applied to the substrate is an RF voltage.

* * * * *